US012599027B2

(12) United States Patent
Tsuyuki et al.

(10) Patent No.: US 12,599,027 B2
(45) Date of Patent: Apr. 7, 2026

(54) ELECTRIC CIRCUIT BODY AND POWER CONVERSION DEVICE

(71) Applicant: HITACHI ASTEMO, LTD., Hitachinaka (JP)

(72) Inventors: Yasuhiro Tsuyuki, Tokyo (JP); Nobutake Tsuyuno, Tokyo (JP); Eiichi Ide, Tokyo (JP); Yujiro Kaneko, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 376 days.

(21) Appl. No.: 18/266,405

(22) PCT Filed: Sep. 29, 2021

(86) PCT No.: PCT/JP2021/035850
§ 371 (c)(1),
(2) Date: Jun. 9, 2023

(87) PCT Pub. No.: WO2022/137701
PCT Pub. Date: Jun. 30, 2022

(65) Prior Publication Data
US 2024/0047231 A1 Feb. 8, 2024

(30) Foreign Application Priority Data

Dec. 22, 2020 (JP) ................................ 2020-212051

(51) Int. Cl.
H01L 21/56 (2006.01)
H01L 23/00 (2006.01)
(Continued)

(52) U.S. Cl.
CPC ........ H01L 21/566 (2013.01); H01L 23/3121 (2013.01); H01L 23/473 (2013.01);
(Continued)

(58) Field of Classification Search
None
See application file for complete search history.

(56) References Cited

U.S. PATENT DOCUMENTS

2012/0001318 A1* 1/2012 Mamitsu ............. H01L 23/4334
257/713
2014/0168901 A1* 6/2014 Ide .................... H01L 23/49575
361/717
(Continued)

FOREIGN PATENT DOCUMENTS

JP 2011-134949 A 7/2011
JP 2012-033872 A 2/2012
(Continued)

OTHER PUBLICATIONS

International Search Report of PCT/JP2021/035850 dated Nov. 22, 2021.
(Continued)

*Primary Examiner* — Sue A Purvis
*Assistant Examiner* — Jordan M Klein
(74) *Attorney, Agent, or Firm* — MATTINGLY & MALUR, PC

(57) ABSTRACT
An electric circuit body including a power semiconductor element joined to one surface of a conductor plate; a sheet member including an insulating layer joined to the other surface of the conductor plate; a sealing member that integrally seals the sheet member, the conductor plate, and the power semiconductor element in a state where a surface of the sheet member opposite to a surface joined to the conductor plate is exposed; a cooling member that cools heat of the power semiconductor element; and a heat conduction member provided between the opposite surface of the sheet member and the cooling member, where the heat conduction member is provided over a first projection region facing the conductor plate and a second projection region facing the (Continued)

sealing member, and a thickness of the heat conduction member is thicker in the second projection region than in the first projection region.

9 Claims, 16 Drawing Sheets

(51) Int. Cl.

| | | |
|---|---|---|
| *H01L 23/31* | (2006.01) | |
| *H01L 23/473* | (2006.01) | |
| *H01L 23/495* | (2006.01) | |
| *H01L 25/11* | (2006.01) | |
| *H01L 25/18* | (2023.01) | |

(52) U.S. Cl.
CPC ............ *H01L 25/115* (2013.01); *H01L 25/18* (2013.01); *H01L 23/49575* (2013.01); *H01L 24/32* (2013.01); *H01L 24/40* (2013.01); *H01L 24/48* (2013.01); *H01L 24/73* (2013.01); *H01L 2224/32245* (2013.01); *H01L 2224/40137* (2013.01); *H01L 2224/48091* (2013.01); *H01L 2224/48245* (2013.01); *H01L 2224/73221* (2013.01); *H01L 2224/73263* (2013.01); *H01L 2224/73265* (2013.01)

(56) References Cited

U.S. PATENT DOCUMENTS

| | | |
|---|---|---|
| 2021/0206906 A1 | 7/2021 | Kiguchi et al. |
| 2022/0013432 A1 | 1/2022 | Shimazu et al. |
| 2023/0154820 A1* | 5/2023 | Yamane .................. H01L 24/48 |
| | | 257/707 |

FOREIGN PATENT DOCUMENTS

| | | |
|---|---|---|
| JP | 2013-258334 A | 12/2013 |
| WO | 2014-034332 A1 | 7/2013 |
| WO | 2018-061517 A1 | 4/2018 |
| WO | 2018-159209 A1 | 9/2018 |
| WO | 2019-229962 A1 | 12/2019 |
| WO | 2020-105407 A1 | 5/2020 |

OTHER PUBLICATIONS

Written Opinion of PCT/JP2021/035850 Dated Nov. 22, 2021.
Japanese Office Action received in corresponding Japanese Application No. 2020-212051 dated Jun. 11, 2024.

* cited by examiner

FIG. 5

ELECTRIC CIRCUIT BODY AND POWER CONVERSION DEVICE

TECHNICAL FIELD

The present invention relates to an electric circuit body and a power conversion device.

BACKGROUND ART

A power conversion device using switching of a power semiconductor element has high conversion efficiency, and thus is widely used for consumer use, in-vehicle use, railway use, transformation equipment, and the like. In this device, a sheet member including an insulating layer is brought into close contact with a conductor plate joined to a power semiconductor element, and a cooling member is further provided by way of a heat conduction member. The power semiconductor element that generates heat by energization is cooled by the cooling member.

PTL 1 discloses a semiconductor device including a semiconductor module manufactured by providing a metal sheet on a metal member on which a semiconductor element is mounted by way of an insulating sheet, exposing the metal sheet to one side surface, and resin-sealing the semiconductor element and the metal member; and a cooling device joined to the metal sheet by way of a solder, and configured to dissipate heat generated by the semiconductor element.

CITATION LIST

Patent Literature

PTL 1: JP 2011-134949 A

SUMMARY OF INVENTION

Technical Problem

In the device described in PTL 1, stress is applied by a heat cycle of energization and non-energization of the power semiconductor element, and the sheet member is peeled off.

Solution to Problem

An electric circuit body according to the present invention is an electric circuit body including a power semiconductor element joined to one surface of a conductor plate; a sheet member including an insulating layer joined to the other surface of the conductor plate; a sealing member that integrally seals the sheet member, the conductor plate, and the power semiconductor element in a state where a surface of the sheet member opposite to a surface joined to the conductor plate is exposed; a cooling member that cools heat of the power semiconductor element; and a heat conduction member provided between the opposite surface of the sheet member and the cooling member, where the heat conduction member is provided over a first projection region facing the conductor plate and a second projection region facing the sealing member, and a thickness of the heat conduction member is thicker in the second projection region than in the first projection region.

Advantageous Effects of Invention

According to the present invention, peeling off of the sheet member can be suppressed.

BRIEF DESCRIPTION OF DRAWINGS

FIGS. 5(a) to 5(c) are cross-sectional views illustrating a method of manufacturing an electric circuit body.

DESCRIPTION OF EMBODIMENTS

Figure 1:
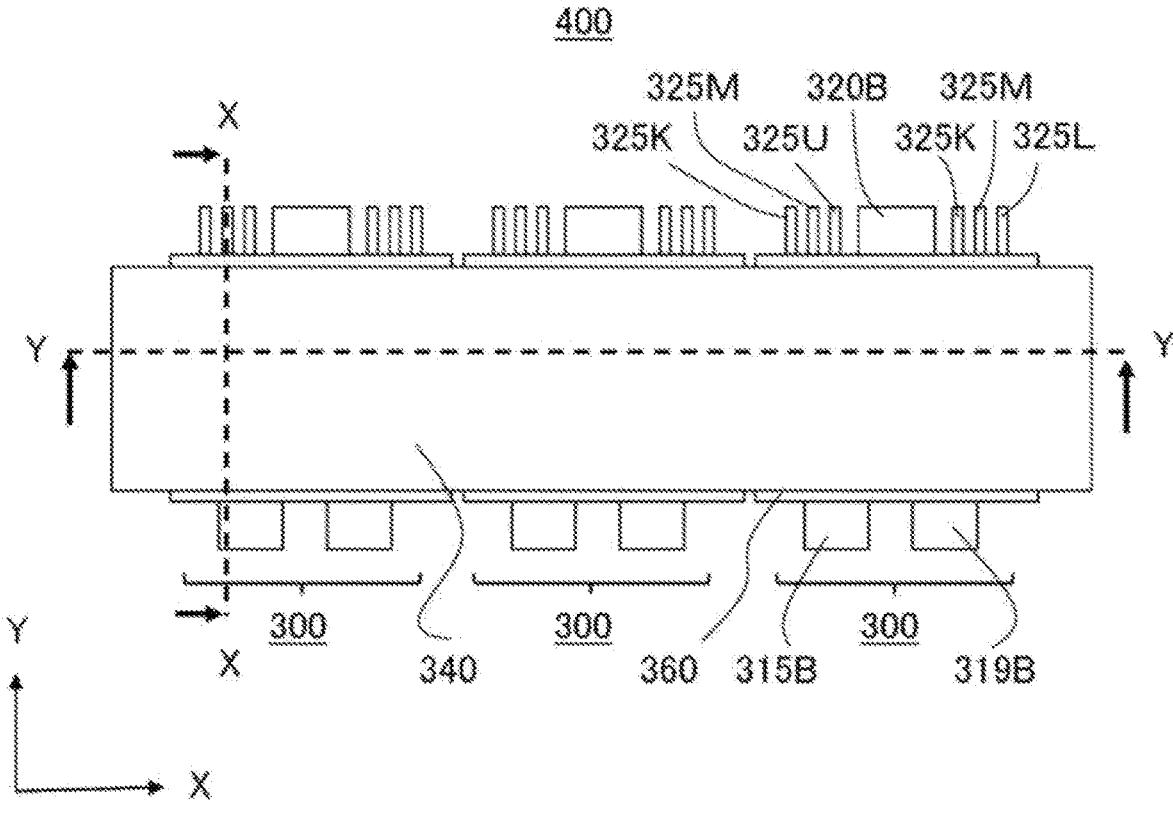
FIG. 1 is a plan view of an electric circuit body.

Hereinafter, embodiments of the present invention will be described with reference to the drawings. The following description and drawings are examples for describing the present invention, and are omitted and simplified as appropriate for the sake of clarity of description. The present invention can be implemented in various other forms. Unless otherwise specified, each component may be singular or plural.

Positions, sizes, shapes, ranges, and the like of the components illustrated in the drawings may not represent actual positions, sizes, shapes, ranges, and the like in order to facilitate understanding of the invention. Therefore, the present invention is not necessarily limited to the position, size, shape, range, and the like disclosed in the drawings.

In a case where there is a plurality of components having the same or similar functions, the description may be made with different subscripts given to the same reference numerals. However, in a case where it is not necessary to distinguish the plurality of components, the description may be made with the subscripts omitted.

Figure 2:
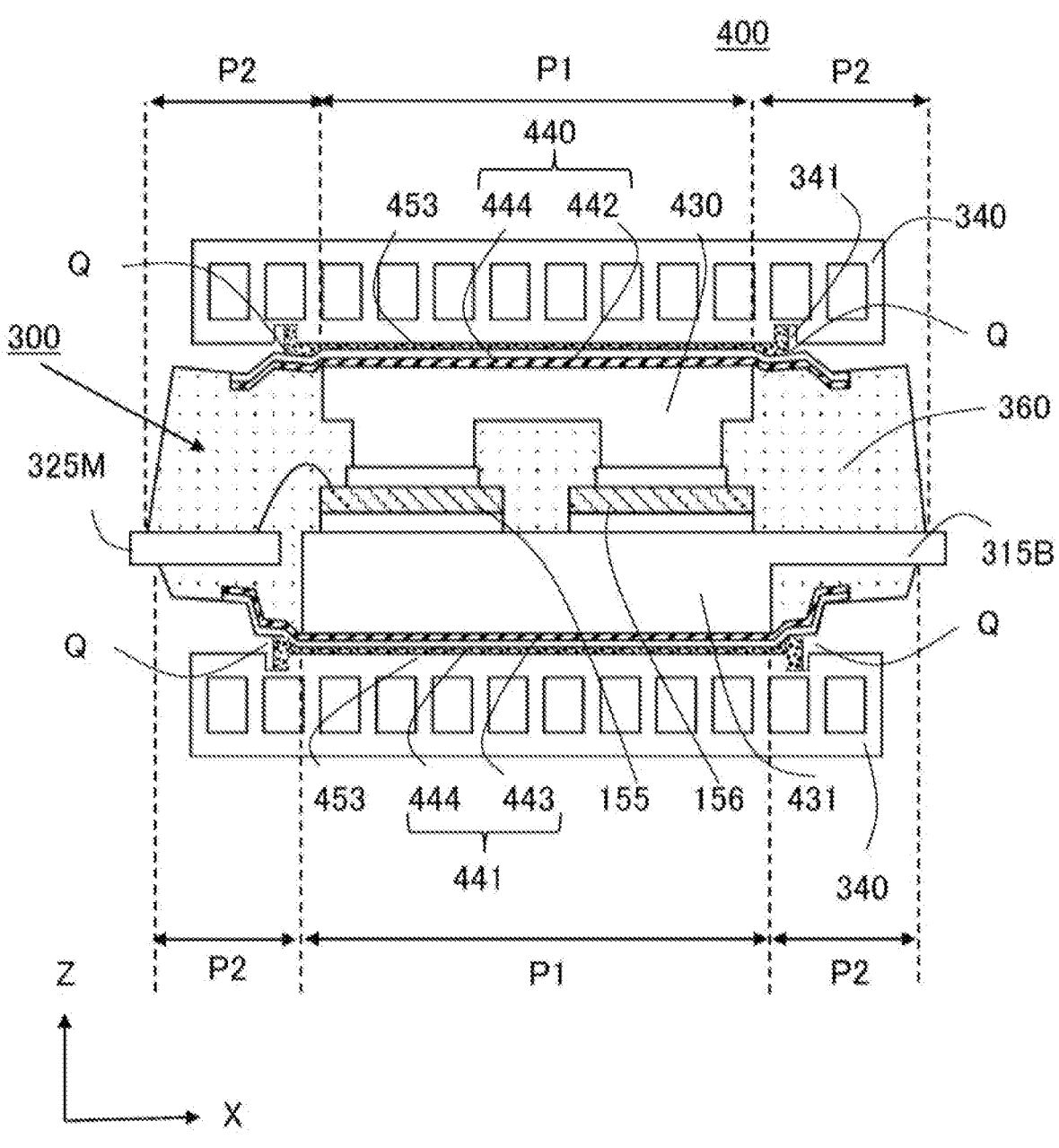
FIG. 2 is a cross-sectional view taken along line X-X of the electric circuit body.
Figure 3:
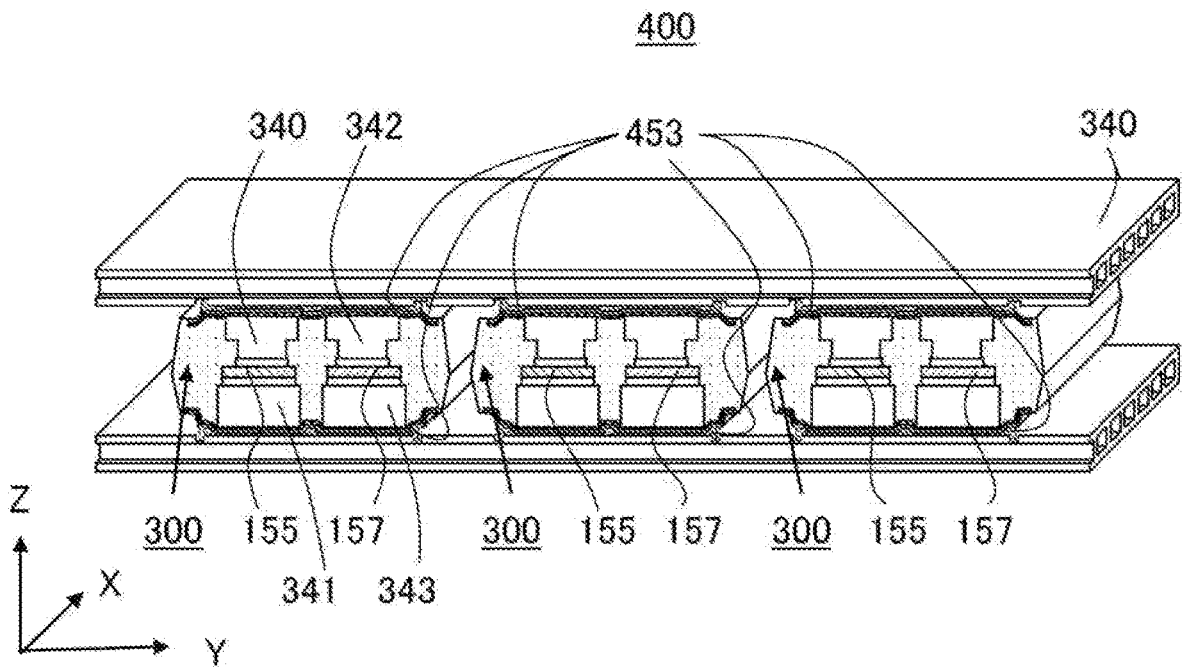
FIG. 3 is a cross-sectional view taken along line Y-Y of the electric circuit body.

FIG. 1 is a plan view of an electric circuit body 400, and FIG. 2 is a cross-sectional view taken along line X-X illustrated in FIG. 1 of the electric circuit body 400. FIG. 3 is a cross-sectional view taken along line YY illustrated in FIG. 1 of the electric circuit body 400.

As illustrated in FIG. 1, the electric circuit body 400 includes three power modules 300 and a cooling member 340. The power module 300 has a function of converting a direct current and an alternating current using a power semiconductor element, and generates heat by energization. Therefore, it has a structure of cooling by circulating refrigerant through the cooling member 340. As the refrigerant, water, an anti-freezing fluid in which ethylene glycol is mixed with water, or the like is used. Note that the cooling member 340 may have a configuration in which pin-shaped fins are provided standing on a base plate of the cooling member 340. The cooling member 340 is desirably made of aluminum having high heat conductivity and light weight. The cooling member 340 is manufactured by extrusion molding, forging, brazing, or the like.

The power module 300 includes, on one side, a positive electrode side terminal 315B and a negative electrode side terminal 319B coupled to a capacitor module 500 (see FIG. 14 described later) of a DC circuit. On the other side of the positive electrode side terminal 315B and the negative electrode side terminal 319B, power terminals, through which a large current flows, such as an AC side terminal 320B coupled to motor generators 192 and 194 (see FIG. 14 described later) of an AC circuit, or the like are provided. In addition, on the other side, signal terminals and the like used for controlling the power module 300 such as a lower arm gate signal terminal 325L, a mirror emitter signal terminal 325M, a Kelvin emitter signal terminal 325K, and an upper arm gate signal terminal 325U are provided.

As illustrated in FIG. 2, an active element 155 and a diode 156 are provided as a first power semiconductor element forming the upper arm circuit. As a semiconductor material constituting the active element 155, for example, Si, SiC, GaN, GaO, C, or the like can be used. When a body diode of the active element 155 is used, the diode 156 may be omitted. A collector side of the active element 155 and a cathode side of the diode 156 are joined to a second conductor plate 431. The first conductor plate 430 is joined to an emitter side of the active element 155 and an anode side of the diode 156. For these joining, solder may be used or sintered metal may be used. In addition, the first conductor plate 430 and the second conductor plate 431 are not particularly limited as long as they are made of a material having high electrical conductivity and high heat conductivity, but a copper-based or aluminum-based material is desirable. These materials may be used alone, but may be plated with Ni, Ag, or the like in order to improve the joining property to solder or sintered metal.

The cooling member 340 is brought into close contact with the first conductor plate 430 through a first sheet member 440 and a heat conduction member 453. The first sheet member 440 is formed by laminating a first resin insulating layer 442 and a metal foil 444, and a metal foil 444 side is in close contact with the heat conduction member 453.

The cooling member 340 is brought into close contact with the second conductor plate 431 through a second sheet member 441 and the heat conduction member 453. The second sheet member 441 is formed by laminating a second resin insulating layer 443 and the metal foil 444, and the metal foil 444 side is in close contact with the heat conduction member 453. From the viewpoint of heat dissipation, the width of the cooling member 340 is desirably wider than the widths of the sheet members 440 and 441.

As illustrated in FIG. 3, an active element 157 and a diode 158 (see FIG. 13 described later) are provided as the second power semiconductor element forming the lower arm circuit. In FIG. 3, the diode 158 is disposed on the far side of the active element 157 in the X-axis direction. A collector side of the active element 157 and a cathode side of the diode 158 are joined to a fourth conductor plate 433. A third conductor plate 432 is joined to an emitter side of the active element 157 and an anode side of the diode 158.

As illustrated in FIG. 3, the first conductor plate 430, the second conductor plate 431, the third conductor plate 432, and the fourth conductor plate 433 serve as a heat transfer member that transfers heat generated by the first power semiconductor elements 155 and 156 and the second power semiconductor elements 157 and 158 to the cooling member 340, in addition to a role of passing current. The conductor plates 430, 431, 432, and 433 are desirably made of a material having high electrical conductivity and high heat conductivity, and a metal-based material such as copper or aluminum, a composite material of a metal-based material and diamond, carbon, ceramic, or the like having high heat conductivity can be used. Since each conductor plate 430, 431, 432, 433 and the cooling member 340 have different potentials, the first sheet member 440 including the first resin insulating layer 442 and the second sheet member 441 including the second resin insulating layer 443 are interposed between each conductor plate 430, 431, 432, 433 and the cooling member 340, as illustrated in FIG. 2. The heat conduction member 453 is provided between each of the sheet members 440 and 441 and the cooling member 340 to reduce contact thermal resistance.

The heat conduction member 453 is not particularly limited as long as it is a material having a high heat conductivity, but a combination of a high thermal conduction material such as a metal including solder, ceramics, or a carbon-based material and a resin material is preferably used. Examples of the solder include Sn3Ag0.5Cu and Sn58Bi, or the like. Examples of a combination of a high thermal conduction material such as ceramics or a carbon-based material and a resin material include a combination of a silicone resin and an alumina.

The first power semiconductor elements 155 and 156, the second power semiconductor elements 157 and 158, the conductor plates 430, 431, 432, and 433, and the sheet members 440 and 441 are sealed with a sealing member 360 by transfer molding. The first resin insulating layer 442 and the second resin insulating layer 443 of each of the sheet members 440 and 441 are not particularly limited as long as they have adhesiveness with each of the conductor plates 430, 431, 432, and 433, but an epoxy resin-based resin insulating layer in which a powdery inorganic filler is dispersed is desirable. This is because the balance between adhesiveness and heat dissipation is good. Each of the sheet members 440 and 441 may be a single resin insulating layer, but it is desirable to provide the metal foil 444 on the side brought into contact with the heat conduction member 453.

In the transfer molding step, when mounting each sheet member 440, 441 on a mold, a release sheet or a metal foil 444 is provided on a contact surface between each sheet member 440, 441 and the mold to prevent adhesion to the mold. Since the release sheet has poor heat conductivity, a step of peeling off the release sheet after transfer molding is required, but in the case of the metal foil 444, it can be used without being peeled off after transfer molding by selecting a copper-based or aluminum-based metal having high heat conductivity. The end portions of the sheet members 440 and 441 are covered with the sealing member 360 by performing transfer molding including the sheet members 440 and 441, and thus there is an effect of improving the reliability of the product.

As illustrated in FIG. 2, the electric circuit body 400 includes a heat conduction member 453 between the sheet members 440 and 441 and the cooling member 340. The heat conduction member 453 is provided over a first projection region P1 facing the conductor plates 430 and 431 and a second projection region P2 facing the sealing member, and the thickness of the heat conduction member 453 is thicker in the second projection region P2 than in the first projection region P1. In the example illustrated in FIG. 2, a concave portion 341 is provided in the cooling member 340 of the second projection region P2, and the heat conduction member 453 enters the concave portion 341, whereby the thickness of the heat conduction member 453 becomes thicker than in the first projection region P1. Note that although the description has been given based on the cross-section taken along line X-X in FIG. 2, the same configuration may be applied to the cross-section taken along line Y-Y.

Stress is applied to the electric circuit body 400 since expansion and contraction are repeated by a heat cycle of energization and de-energization of the power semiconductor elements 155 and 156. This stress is a total value of the two forces of the tensile stress and the shear stress, and is concentrated at the end portion of the heat conduction member 453. At the end portion of the heat conduction member 453, the tensile stress acts in the horizontal direction (X and Y directions) toward the outside of the electric circuit body 400, and the shear stress acts in the vertical direction (Z direction) toward the outside of the electric circuit body 400. The shear stress is inversely proportional to the thickness of the heat conduction member 453, where the influence of the shear stress is greater the thinner the thickness, and the influence of the shear stress is smaller the thicker the thickness. As the influence of the shear stress increases, the sheet members 440 and 441 are more likely to be peeled off. Therefore, the influence of the generated shear stress is reduced by increasing the thickness of the heat conduction member 453 at the end portion where the stress concentrates the most in the second projection region P2. As a result, peeling of the sheet members 440 and 441 can be suppressed and deterioration in insulating property and heat dissipation property of the electric circuit body 400 can be prevented.

Furthermore, the outer edge Q of the joining region where the heat conduction member 453 and the sheet members 440 and 441 are adhered or joined is located on the outer peripheral side of the first projection region P1. As a result, the outer edge Q of the joining region can be separated, that is, take a distance from the conductor plates 430 and 431, and thus, even if the sheet members 440 and 441 are peeled off, deterioration in insulating property and heat dissipation property of the electric circuit body 400 can be prevented.

In addition, the cooling member 340 is provided to include the first projection region P1 facing the conductor plates 430 and 431, and is further provided to include the outer edge Q of the joining region where the heat conduction member 453 and the sheet members 440 and 441 are adhered or joined. The outer edge Q is located in the second projection region P2. The end portion of the cooling member 340 is located in the second projection region P2. This makes it possible to prevent deterioration in insulating property and heat dissipation property of the electric circuit body 400 without degrading the heat dissipation property of the cooling member 340.

Figure 4:
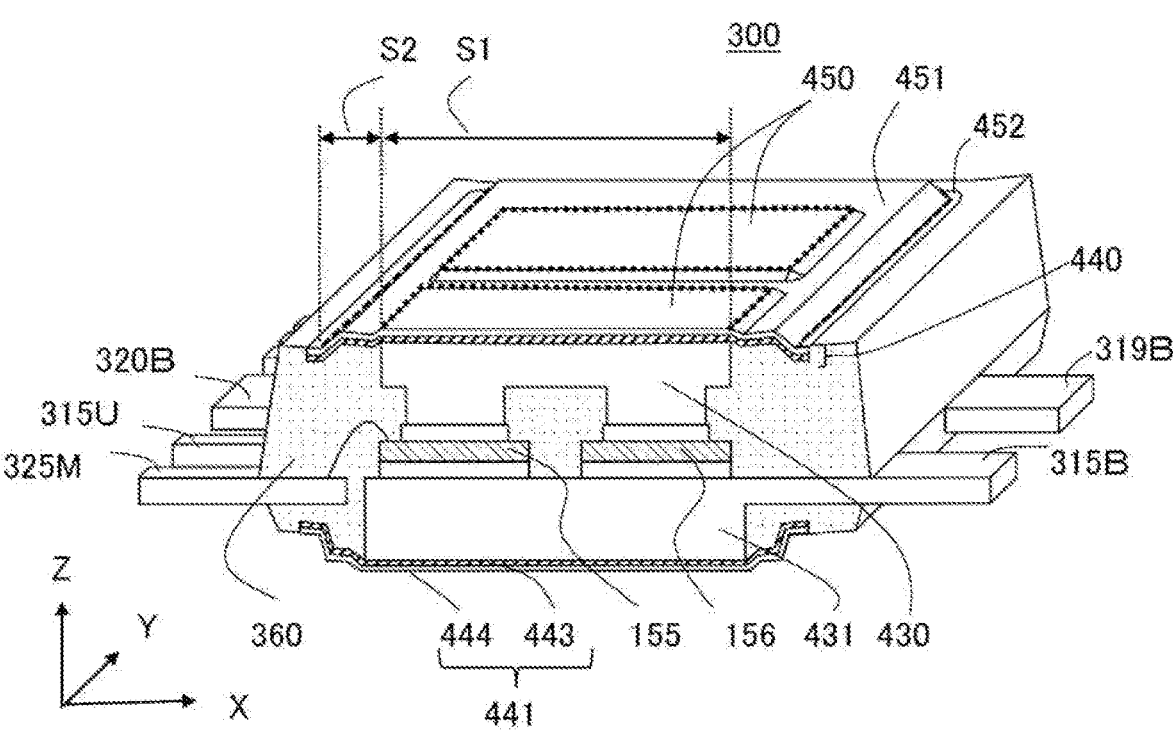
FIG. 4 is a cross-sectional perspective view of a power module along line X-X.

FIG. 4 is a cross-sectional perspective view of the power module 300 taken along line X-X illustrated in FIG. 1, and illustrates a state in which the cooling member 340 and the heat conduction member 453 are removed from the electric circuit body 400. As illustrated in FIG. 4, the end portion of the first sheet member 440 is covered with a sealing member 360. The first sheet member 440 overlapping the surface of the first conductor plate 430 serves as a heat dissipation surface. The cooling member 340 is brought into close contact with the heat dissipation surface of the first sheet member 440 so that the heat dissipation property is not impaired.

Although the heat conduction member 453 is not illustrated in FIG. 4, an area S2 where the heat conduction member 453 is adhered or joined to the surface of the first sheet member 440 exposed from the sealing member 360 is larger than an area S1 of the first projection region P1 facing the conductor plate 430. As a result, the first sheet member 440 can be separated, that is, take a distance from the conductor plate 430, and thus, even if the sheet members 440 and 441 are peeled off, deterioration in insulating property and heat dissipation property of the electric circuit body 400 can be prevented.

Figure 5:
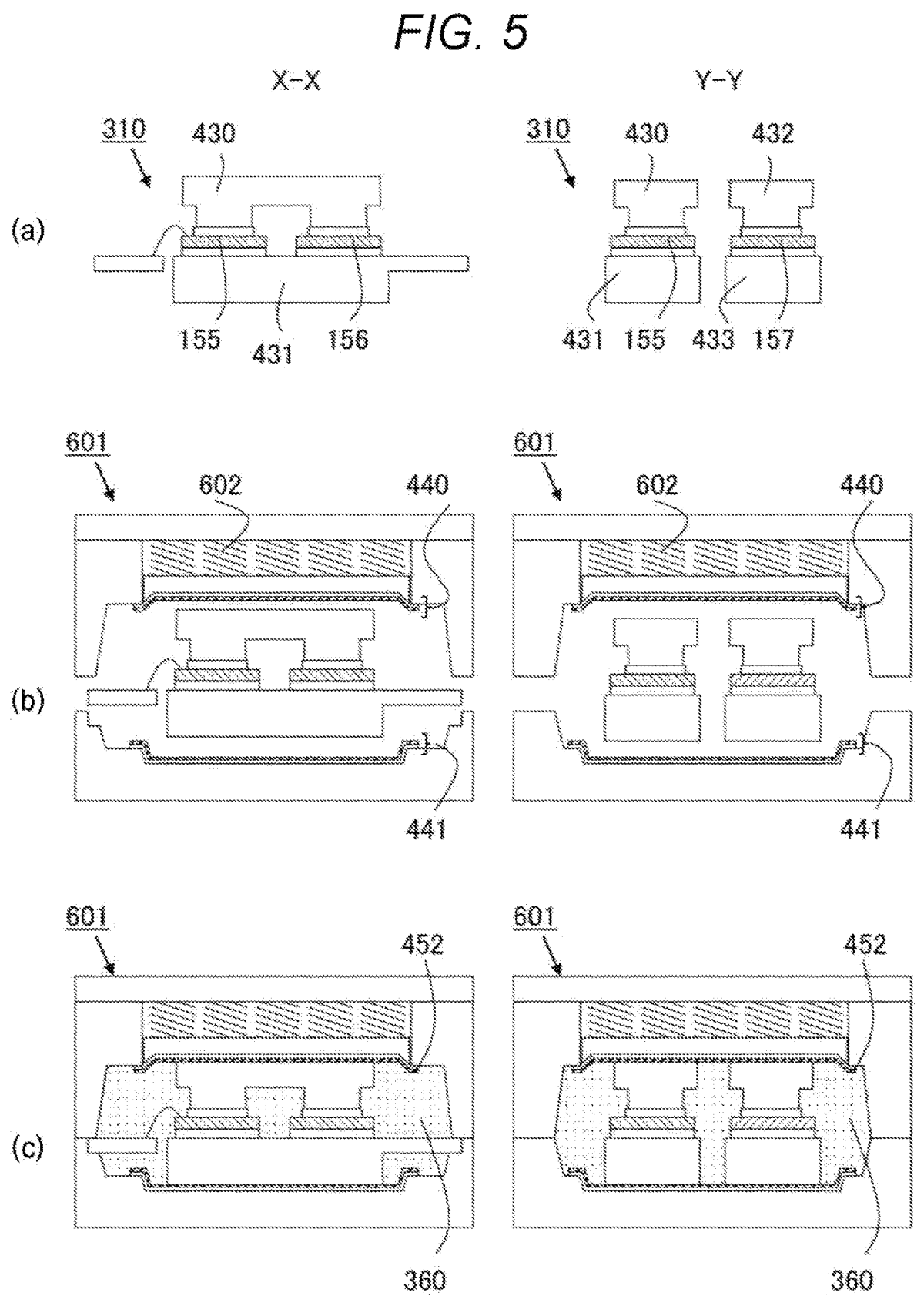
Figure 6:
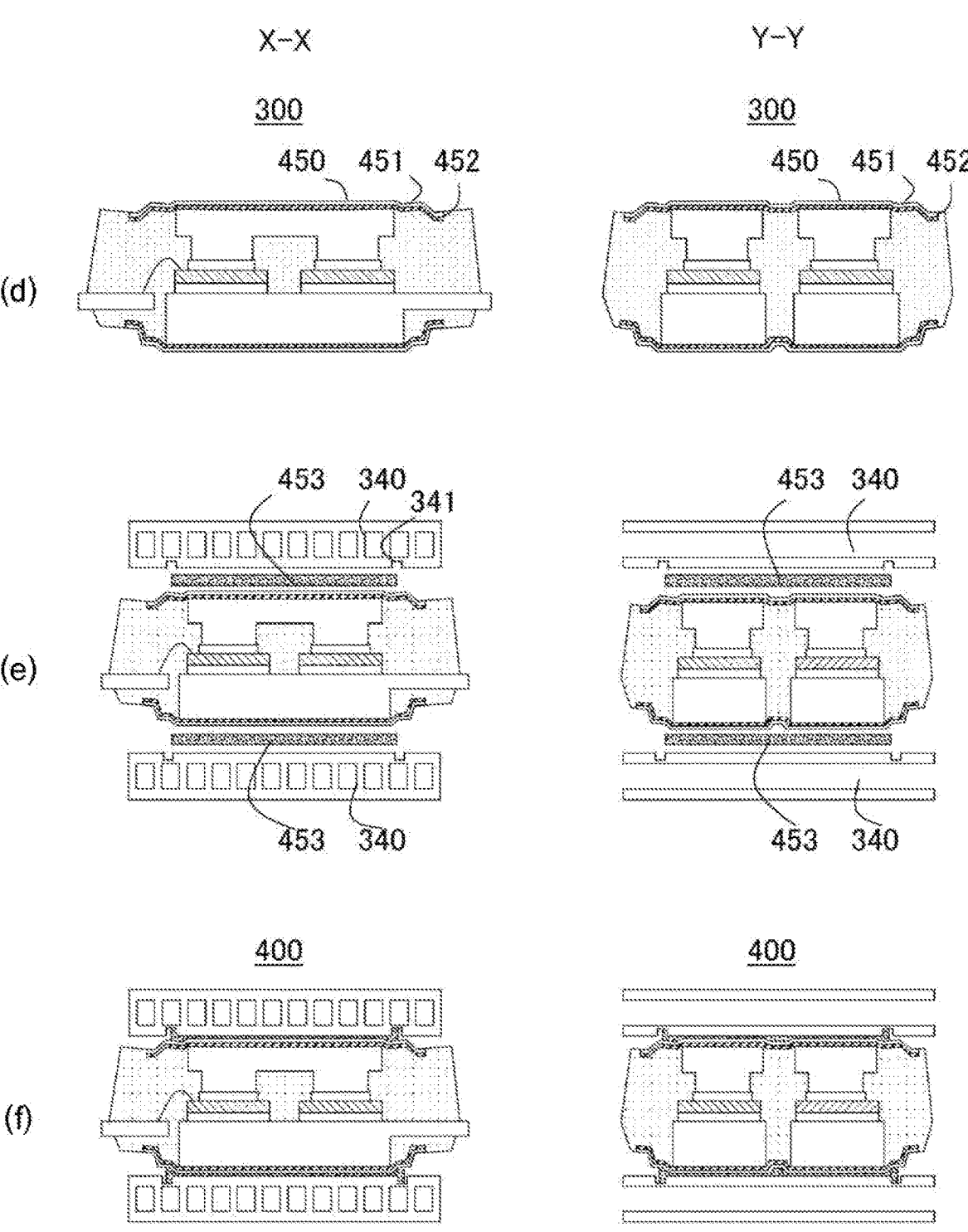
FIGS. 6(d) to 6(f) are cross-sectional views illustrating a method of manufacturing the electric circuit body.

FIGS. 5(*a*) to 5(*c*) and FIGS. 6(*d*) to 6(*f*) are cross-sectional views illustrating a method of manufacturing the electric circuit body 400. A cross-sectional view of one power module taken along line X-X illustrated in FIG. 1 is illustrated on the left side of each drawing, and a cross-sectional view of one power module taken along line Y-Y illustrated in FIG. 1 is illustrated on the right side of each drawing.

FIG. 5(*a*) is a view illustrating a solder connecting step and a wire bonding step. The collector side of the active element 155, which is the first power semiconductor element, and the cathode side of the diode 156 are connected to the second conductor plate 431, and the gate electrode of the active element 155 is connected by wire bonding. The emitter side of the active element 155 and the anode side of the diode 156 are connected to the first conductor plate 430. Similarly, the collector side of the active element 157, which is the second power semiconductor element, and the cathode side of the diode 158 are connected to the fourth conductor plate 433, and the gate electrode of the active element 157 is connected by wire bonding. The emitter side of the active element 157 and the anode side of the diode 158 are connected to the third conductor plate 432. In this manner, the circuit body 310 is formed.

FIG. 5(*b*) is a view illustrating a mold installing step. The circuit body 310 and the sheet members 440 and 441 are installed in a mold in the transfer molding device 601. The transfer molding device 601 includes a mechanism for vacuum-suctioning a spring 602 and the sheet members 440 and 441 to the mold and a vacuum degassing mechanism. The transfer molding device 601 holds the sheet members 440 and 441 in the mold heated to a constant temperature state of 175° C. in advance by vacuum suction. Then, the circuit body 310 preheated to 175° C. in advance is disposed at a position away from the sheet members 440 and 441.

FIG. 5(*c*) is a view illustrating a pressurizing step. In this step, the upper and lower molds are brought close to each other from a state where the sheet members 440 and 441 and the circuit body 310 are separated from each other, and only the packings installed around the upper and lower molds (not illustrated) are brought into contact with each other. Next, the mold cavity is vacuum exhausted. When vacuum exhaustion to less than or equal to a predetermined atmospheric pressure is completed, the packing is further crushed, and the upper and lower molds are completely clamped. At this time, the sheet members 440 and 441 and the circuit body 310 are in contact with each other. In a vacuum state, the sheet members 440 and 441 and the circuit body 310 come into contact with each other and come into close contact with each other by pressurization force of the spring 602, so that they can be brought into close contact with each other without involving voids. Then, the sealing member 360 is injected into the mold cavity.

FIG. 6(*d*) is a view illustrating a curing step. The power module 300 sealed with the sealing member 360 is taken out from the transfer molding device 601, cooled at room temperature, and cured for 2 hours or more.

FIG. 6(*e*) is a view illustrating a disposing step of the cooling member 340. In this step, the heat conduction member 453 is installed at a position that covers the sheet members 440 and 441 exposed from the surface of the sealing member 360, and the cooling member 340 in which the concave portion 341 is formed is disposed at a position that covers the heat conduction member 453.

FIG. 6(*f*) is a view illustrating an installing step of the cooling member 340. In this step, the heat conduction member 453 and the cooling member 340 are adhered.

Since the cooling member 340 is formed with the concave portion 341, when adhering the heat conduction member 453 and the cooling member 340, the heat conduction member 453 is pressed and the heat conduction member 453 enters the concave portion 454 formed in the sealing member 360. In a case where the heat conduction member 453 is metal-based, this step is performed under a heating environment. The heating temperature varies depending on the melting point of the metal used. Then, the cooling member 340 is brought into close contact with the first sheet member 440 and the second sheet member 441 by way of the heat conduction member 453.

In the electric circuit body 400 manufactured by the above steps, the heat conduction member 453 is pressed and the part that protruded in the horizontal direction enters the concave portion 341, where the thickness of the heat conduction member 453 is thicker in the second projection region P2 than in the first projection region P1.

Figure 7:
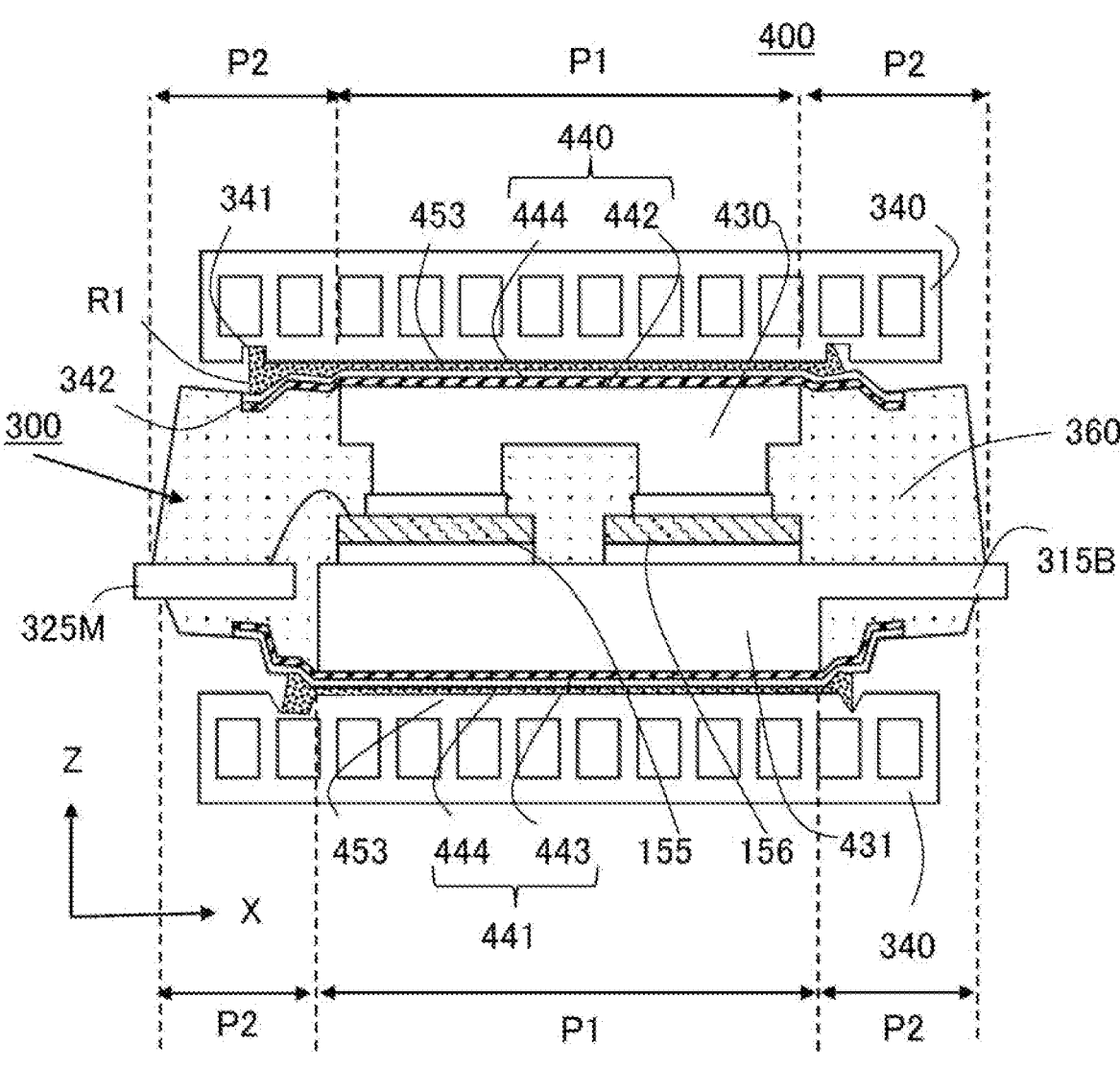
FIG. 7 is a cross-sectional view taken along line X-X of an electric circuit body in a first modified example.

FIG. 7 is a cross-sectional view taken along line X-X illustrated in FIG. 1 of the electric circuit body 400 in a first modified example. The same portions as those of the electric circuit body 400 illustrated in FIG. 2 are denoted with the same reference numerals, and the description thereof will be omitted. Note that the configuration described below will be described based on the cross-section taken along line X-X, but the same configuration may be applied to the cross-section taken along line Y-Y.

In the first modified example illustrated in FIG. 7, the end portion of the sheet member 440 is depressed in the sealing member 360 to form the concave portion 342. The end portion R1 of the heat conduction member 453 is located in the concave portion 342 of the depressed sheet member 440. Since the heat conduction member 453 enters the concave portion 342 of sheet member 440 and the concave portion 341 of the cooling member 340, the heat conduction member 453 can be thickened in the second projection region P2. As described above, the thickness of the heat conduction member 453 in the second projection region P2 may extend not only in the direction of the concave portion 341 of the cooling member 340, that is, in the Z direction, but also in the direction of the concave portion 342 of the sheet member 440, that is, in the opposite direction of the Z direction. Note that the cross-sectional shape of the concave portions 341 and 342 may be any shape such as a trapezoidal shape or a triangular shape, and may be thicker than the heat conduction member 453 in the first projection region P1. The shape of the heat conduction member 453 entering the concave portions 341 and 342 may also be any shape. In addition, both concave portions 341 and 342 do not necessarily need to be provided, and at least one of the concave portions may be provided. The positions to provide the concave portions 341 and 342 may be any position within the second projection region P2, or may be provided at a plurality of locations.

Figure 8:
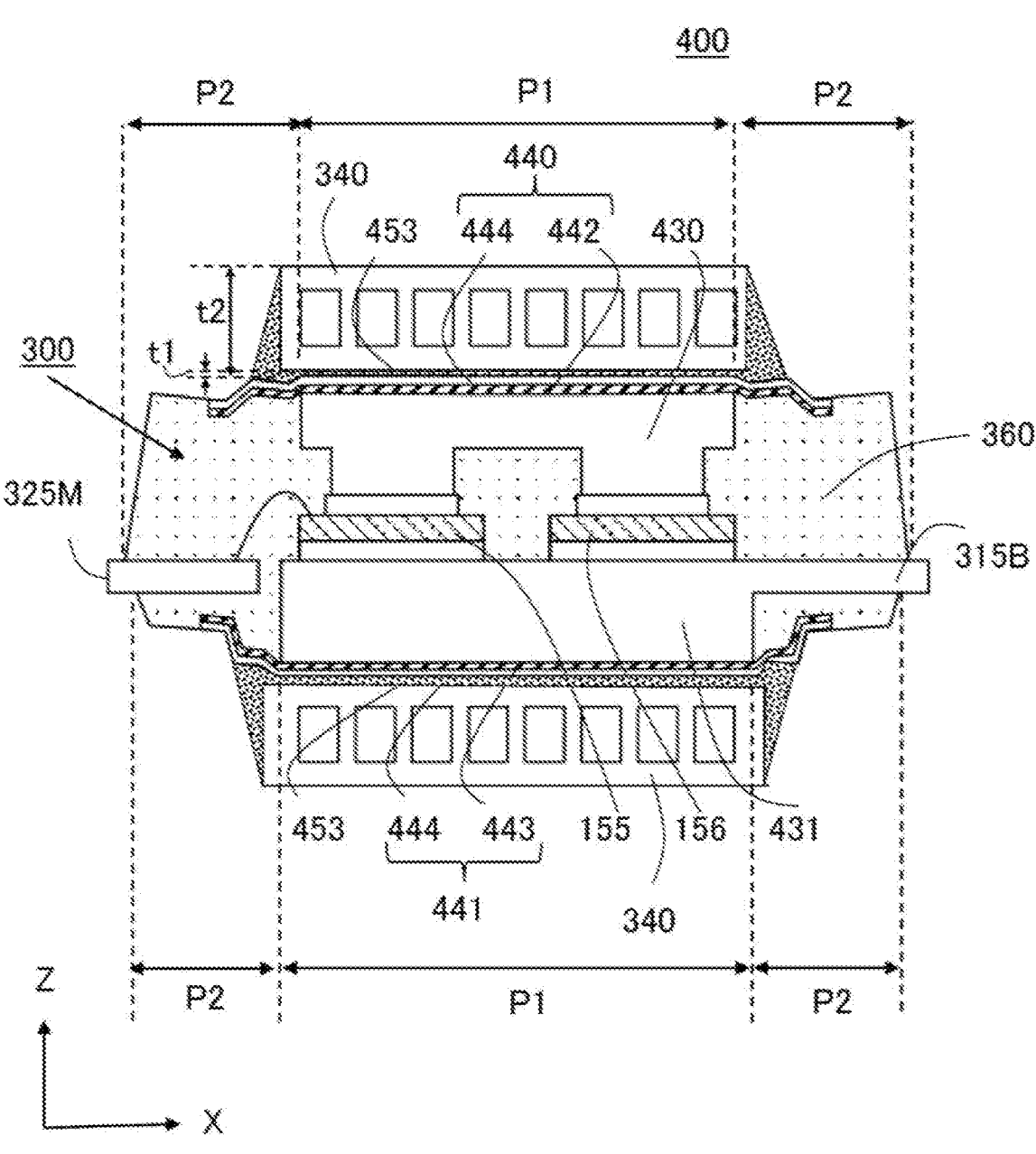
FIG. 8 is a cross-sectional view taken along line X-X of an electric circuit body in a second modified example.

FIG. 8 is a cross-sectional view taken along line X-X illustrated in FIG. 1 of the electric circuit body 400 in a second modified example. The same portions as those of the electric circuit body 400 illustrated in FIG. 2 are denoted with the same reference numerals, and the description thereof will be omitted. Note that the configuration described below will be described based on the cross-section taken along line X-X, but the same configuration may be applied to the cross-section taken along line Y-Y.

In the second modified example illustrated in FIG. 8, the cooling member 340 is longer than the first projection region P1, and the end portion of the cooling member 340 is located in the second projection region P2. Then, the heat conduction member 453 is adhered or joined to the side surface of the end portion of the cooling member 340. Accordingly, the thickness t2 of the heat conduction member 453 in the second projection region P2 becomes thicker than the thickness t1 of the first projection region P1.

Figure 9:
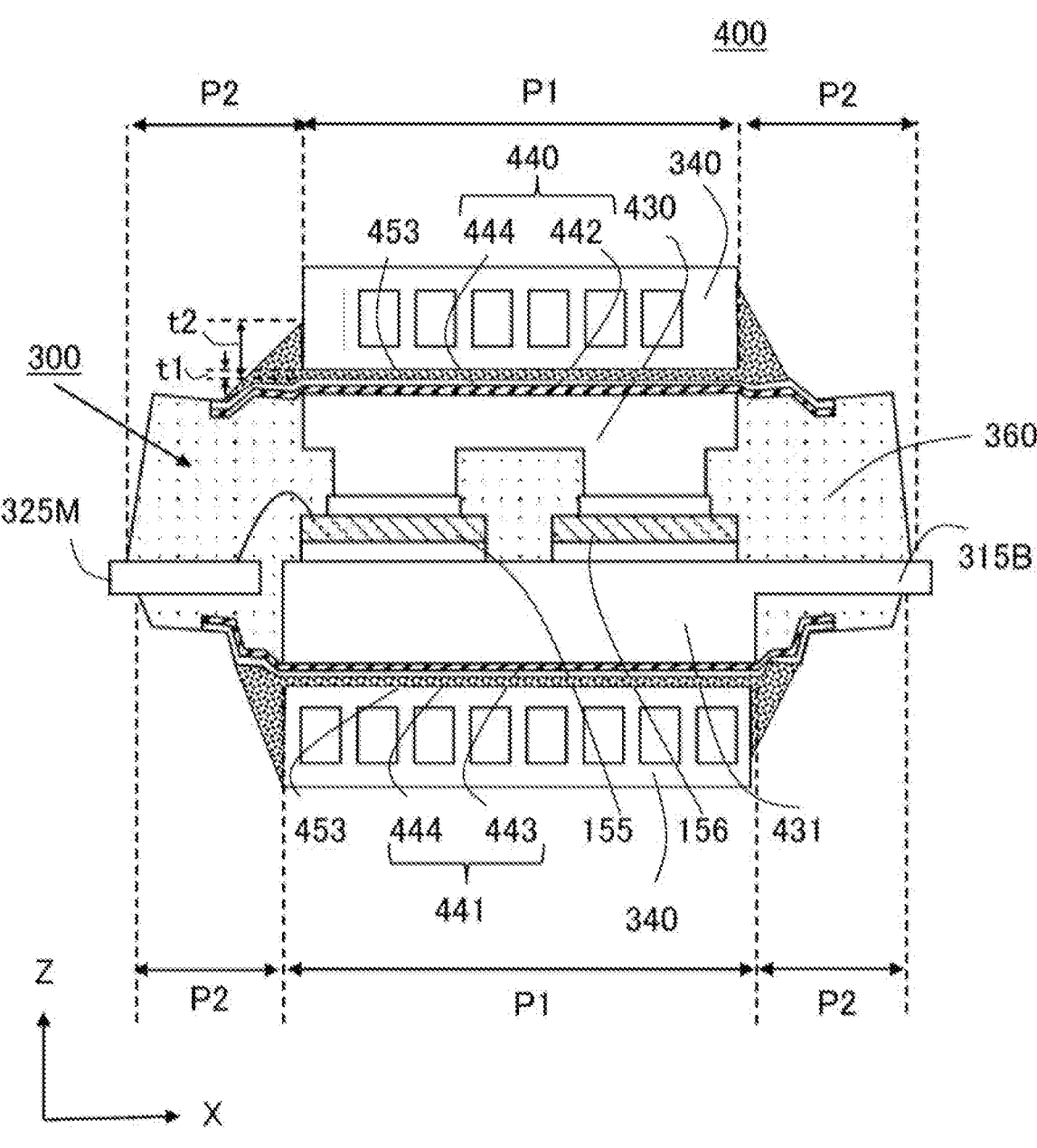
FIG. 9 is a cross-sectional view taken along line X-X of an electric circuit body in a third modified example.

FIG. 9 is a cross-sectional view taken along line X-X illustrated in FIG. 1 of the electric circuit body 400 in a third modified example. The same portions as those of the electric circuit body 400 illustrated in FIG. 2 are denoted with the same reference numerals, and the description thereof will be omitted. Note that the configuration described below will be described based on the cross-section taken along line X-X, but the same configuration may be applied to the cross-section taken along line Y-Y.

In the third modified example illustrated in FIG. 9, the cooling member 340 is in the same region as the first projection region P1, and the end portion of the cooling member 340 is located at the boundary of the first projection region P1 and the second projection region P2. Then, the heat conduction member 453 is adhered or joined to the side surface of the end portion of the cooling member 340. The heat conduction member 453 adhered to the side surface of the end portion of the cooling member 340 does not necessarily have to be adhered to the entire side surface of the cooling member 340, and the thickness t2 to the vertex of the heat conduction member 453 does not have to be the same on the left and right. In the case of the third modified example as well, the thickness t2 of the heat conduction member 453 in the second projection region P2 is thicker than the thickness t1 of the first projection region P1.

Figure 10:
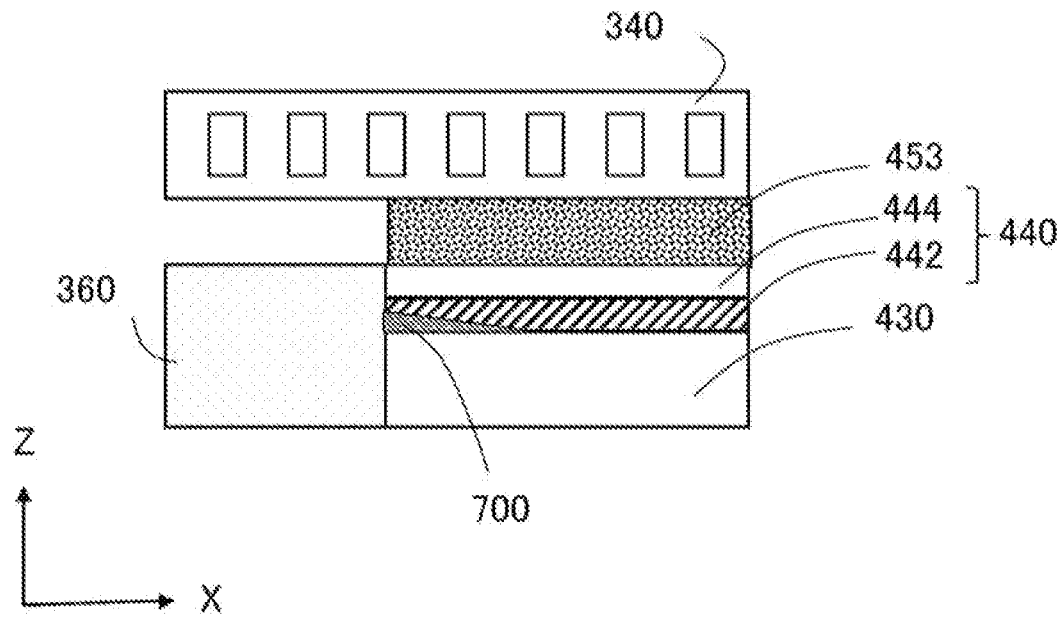
FIG. 10 is a cross-sectional view of a main part illustrating a first comparative example in a case where the present embodiment is not applied.

FIG. 10 is a cross-sectional view of a main part illustrating a first comparative example in a case where the present embodiment is not applied.

In the first comparative example, a sheet member 440 having a resin insulating layer 442 and a metal foil 444 and a heat conduction member 453 are provided between a conductor plate 430 and a cooling member 340, and an end portion of the sheet member 440 is covered with a sealing member 360. The position of the end portion of the sheet member 440 coincides with the position of the end portion of the heat conduction member 453.

Stress is applied to the electric circuit body 400 since expansion and contraction are repeated by a heat cycle of energization and de-energization of a power semiconductor element 159. This stress is a total value of the two forces of the tensile stress and the shear stress, and is concentrated at the end portion of the heat conduction member 453. As a result, a peeled portion 700 is generated between the resin insulating layer 442 and the conductor plate 430, and the heat conduction member 453 containing a conductive substance enters the peeled portion, so that the insulating property and the heat dissipation property of the electric circuit body 400 are deteriorated.

Figure 11:
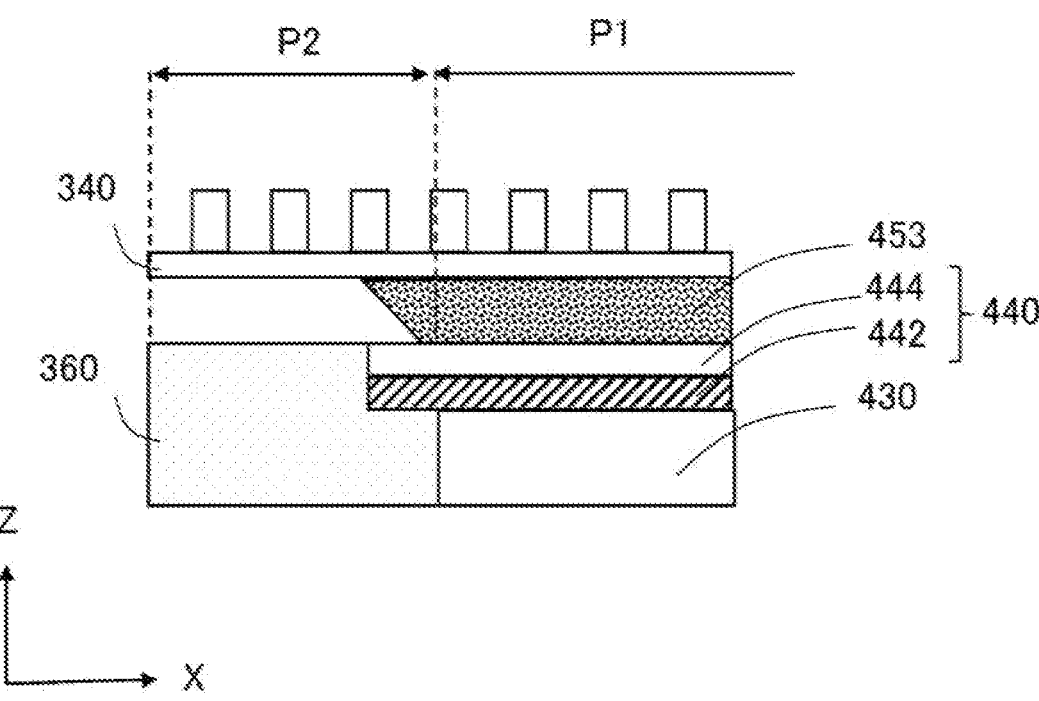
FIG. 11 is a cross-sectional view of a main part illustrating a second comparative example in a case where the present embodiment is not applied.

FIG. 11 is a cross-sectional view of a main part illustrating a second comparative example in a case where the present embodiment is not applied. The same portions as those in the first comparative example are denoted by the same reference numerals, and the description thereof will be omitted.

In the second comparative example, the thickness of the heat conduction member 453 in the second projection region P2 facing the sealing member 360 is equal to or thinner than the thickness of the first projection region P1 facing the conductor plate 430. For this reason, stress concentrated at the end portion of the heat conduction member 453 cannot be avoided, and peeling occurs between the sheet member 440 and the conductor plate 430, so that the insulating property and the heat dissipation property of the electric circuit body 400 are deteriorated.

According to the present embodiment, since the influence of stress applied to the sheet member can be reduced, peeling of the sheet member can be suppressed and deterioration in the insulating property and the heat dissipation property of the electric circuit body 400 can be prevented.

Figure 12:
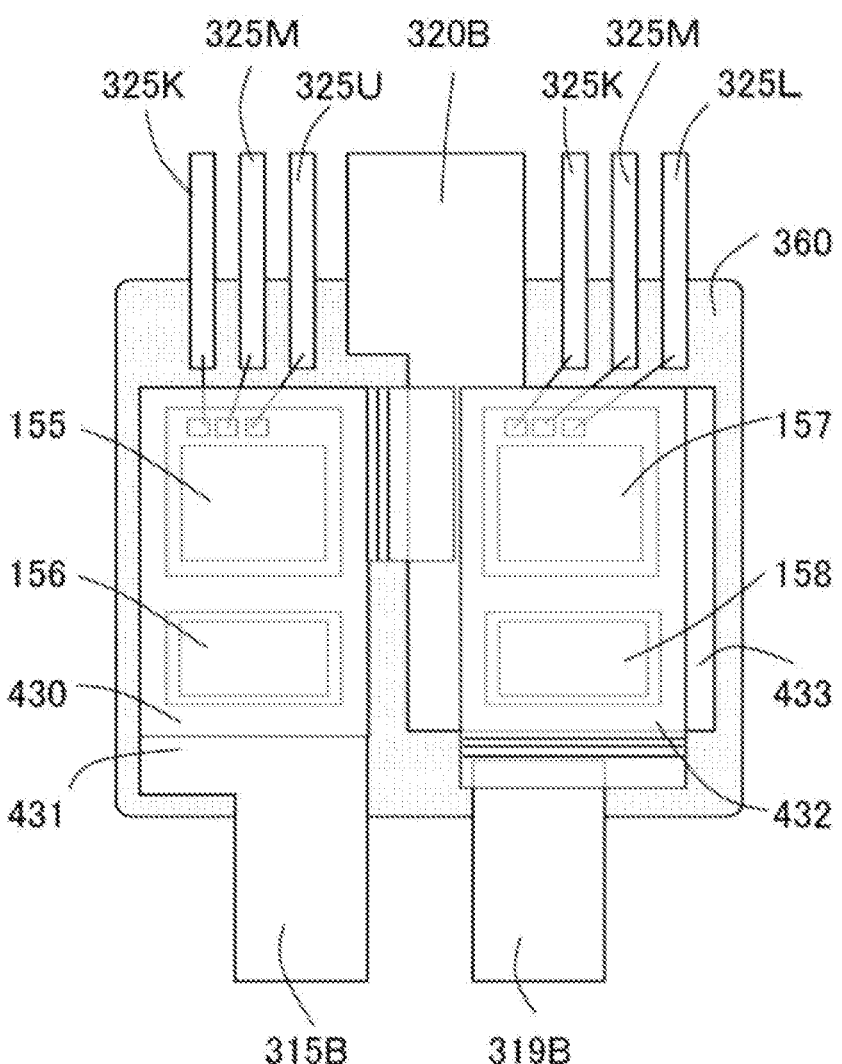
FIG. 12 is a semi-transparent plan view of the power module in the present embodiment.
Figure 13:
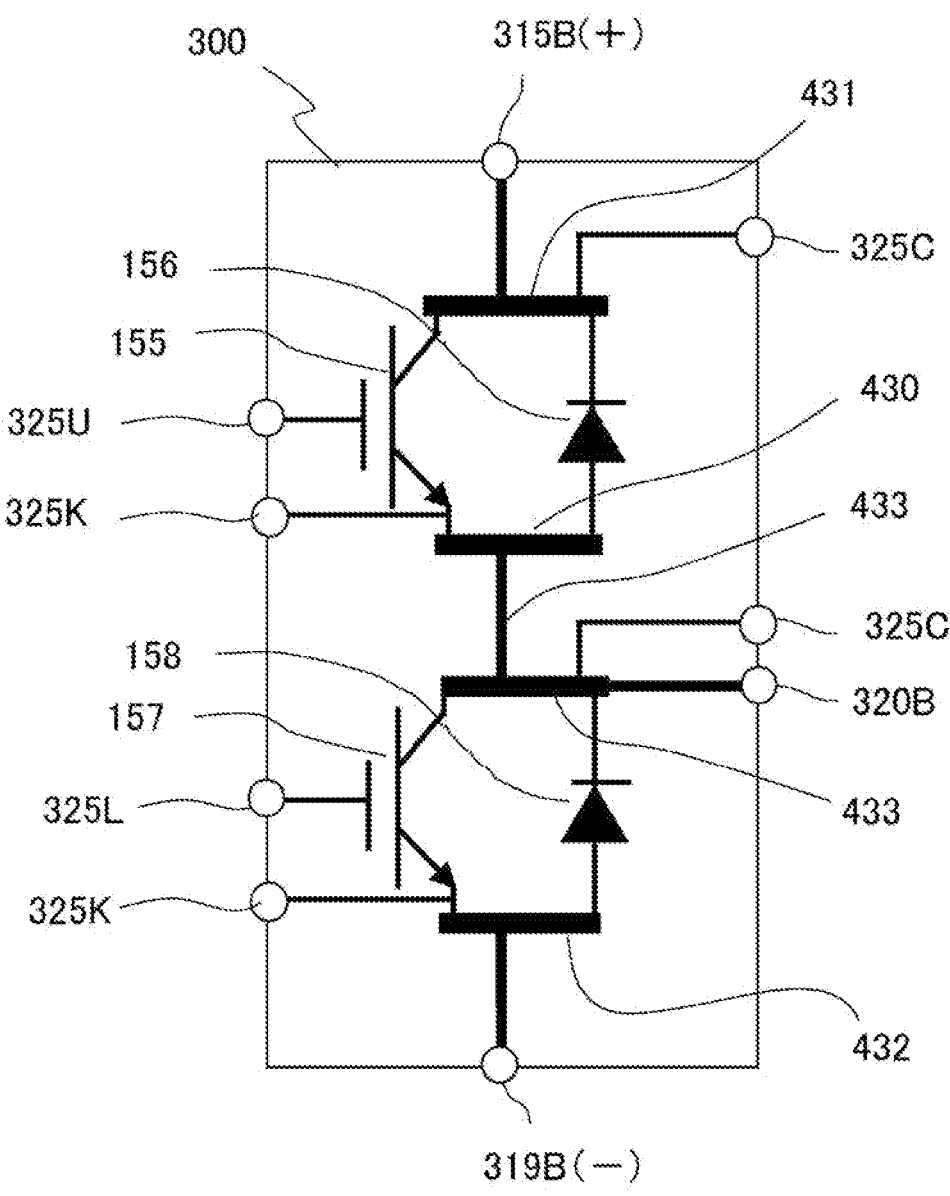
FIG. 13 is a circuit diagram of a power module in the present embodiment.

FIG. 12 is a semi-transparent plan view of the power module 300 in the present embodiment. FIG. 13 is a circuit diagram of the power module 300 in the present embodiment.

As shown in FIGS. 12 and 13, a positive electrode side terminal 315B is output from a collector side of an upper arm circuit, and is connected to a positive electrode side of a battery or a capacitor. An upper arm gate signal terminal 325U is output from a gate and an emitter sense of an active element 155 of the upper arm circuit. A negative electrode side terminal 319B is output from an emitter side of a lower arm circuit, and is connected to a negative electrode side of the battery or the capacitor or GND. A lower arm gate signal terminal 325L is output from a gate and an emitter sense of an active element 157 of the lower arm circuit. An AC side terminal 320B is output from the collector side of the lower arm circuit and is connected to a motor. When a neutral point is grounded, the lower arm circuit is connected not to the GND but to the negative electrode side of the capacitor.

In addition, a first conductor plate (upper arm circuit emitter side) 430 and a second conductor plate (upper arm circuit collector side) 431 are disposed above and below the active element 155 and the diode 156 of the first power semiconductor element (upper arm circuit). A third conductor plate (lower arm circuit emitter side) 432 and a fourth conductor plate (lower arm circuit collector side) 433 are disposed above and below the active element 157 and the diode 158 of the second power semiconductor element (lower arm circuit).

On the surface of the sealing member 360, a concave portion 454 is formed around along the outer edge of the first sheet member 440 on the outer peripheral side of the first sheet member 440 (not illustrated).

The power module 300 of the present embodiment has a 2 in 1 structure in which two arm circuits of the upper arm circuit and the lower arm circuit are integrated into one module. In addition, a structure in which a plurality of upper arm circuits and lower arm circuits are integrated into one module may be used. In this case, the number of output terminals from the power module 300 can be reduced and the size can be reduced.

Figure 14:
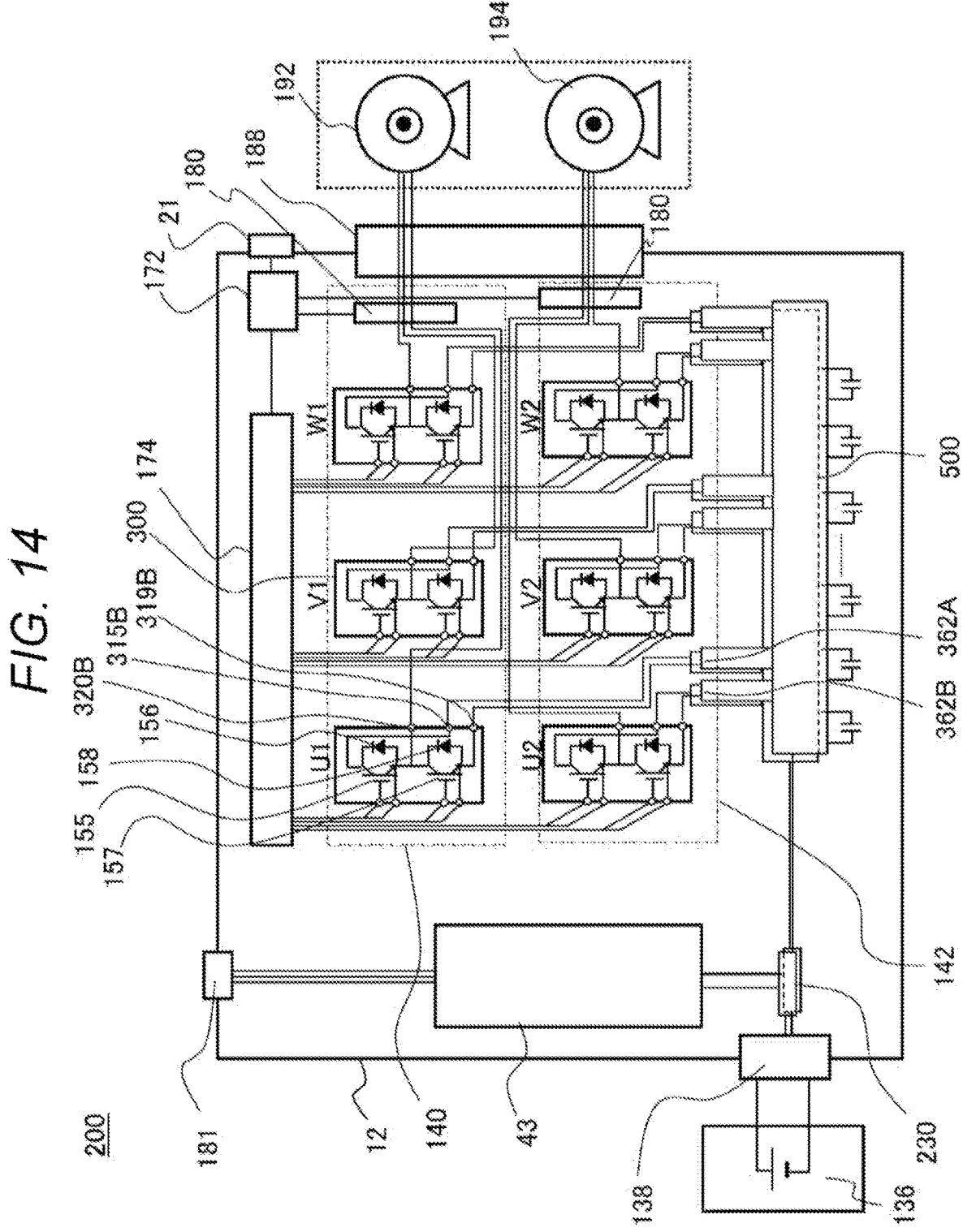
FIG. 14 is a circuit diagram of a power conversion device using an electric circuit body.

FIG. 14 is a circuit diagram of a power conversion device 200 using the electric circuit body 400.

The power conversion device 200 includes inverter circuits 140 and 142, an auxiliary inverter circuit 43, and a capacitor module 500. The inverter circuits 140 and 142 are configured by an electric circuit body 400 (not illustrated) including a plurality of power modules 300, and a three-phase bridge circuit is configured by connecting them. When the current capacity is large, the power modules 300 are further connected in parallel, where increase in current capacity can be responded by performing the parallel connection in correspondence with each phase of the three-phase inverter circuit. In addition, increase in current capacity can also be responded by connecting the active elements 155 and 157 and the diodes 156 and 158, which are power semiconductor elements incorporated in the power module 300, in parallel.

The inverter circuit 140 and the inverter circuit 142 have the same basic circuit configuration, and basically the same control method and operation. Since an outline of a circuit operation of the inverter circuit 140 and the like is well known, a detailed description thereof will be omitted here.

As described above, the upper arm circuit includes the upper arm active element 155 and the upper arm diode 156 as power semiconductor elements for switching, and the lower arm circuit includes the lower arm active element 157 and the lower arm diode 158 as power semiconductor elements for switching. The active elements 155 and 157 perform switching operation in response to a drive signal output from one or the other of the two driver circuits constituting the driver circuit 174, and convert DC power supplied from the battery 136 into three-phase AC power.

As described above, the active element 155 for the upper arm and the active element 157 for the lower arm include a collector electrode, an emitter electrode, and a gate electrode. The diode 156 for the upper arm and the diode 158 for the lower arm include two electrodes of a cathode electrode and an anode electrode. As illustrated in FIG. 13, the cathode electrodes of the diodes 156 and 158 are electrically connected to the collector electrodes of the active elements 155 and 157, respectively, and the anode electrodes are electrically connected to the emitter electrodes of the active elements 155 and 157, respectively. As a result, the current flows in the forward direction from the emitter electrode to the collector electrode of the active element 155 for the upper arm and the active element 157 for the lower arm.

Note that a metal oxide semiconductor field effect transistor (MOSFET) may be used as the active element, in which case, the diode 156 for the upper arm and the diode 158 for the lower arm are unnecessary.

The positive electrode side terminal 315B and the negative electrode side terminal 319B of each of the upper and lower arm series circuits are connected to the DC terminals 362A and 362B for capacitor connection of the capacitor module 500, respectively. The AC power is generated at each connecting portion between the upper arm circuit and the lower arm circuit, and the connecting portion between the upper arm circuit and the lower arm circuit of each of the upper and lower arm series circuits is connected to the AC side terminal 320B of each power module 300. The AC side terminal 320B of each power module 300 of each phase is connected to the AC output terminal of the power conversion device 200, and the generated AC power is supplied to the stator winding of the motor generator 192 or 194.

The control circuit 172 generates a timing signal for controlling the switching timing of the active element 155 for the upper arm and the active element 157 for the lower arm based on input information from a control device, a sensor (e.g., the current sensor 180), or the like on the vehicle side. The driver circuit 174 generates a drive signal for causing the active element 155 for the upper arm and the active element 157 for the lower arm to perform the switching operation based on the timing signal output from the control circuit 172. Note that reference numerals 181, 182, and 188 denote connectors.

The upper and lower arm series circuits include a temperature sensor (not illustrated), and temperature information of the upper and lower arm series circuits is input to the control circuit 172. Furthermore, voltage information on the DC positive electrode side of the upper and lower arm series circuits is input to the control circuit 172. The control circuit 172 performs overtemperature detection and overvoltage detection based on these pieces of information, stops the switching operation of all the active elements 155 for the upper arm and the active elements 157 for the lower arm when overtemperature or overvoltage is detected to protect the upper and lower arm series circuits from overtemperature or overvoltage.

Figure 15:
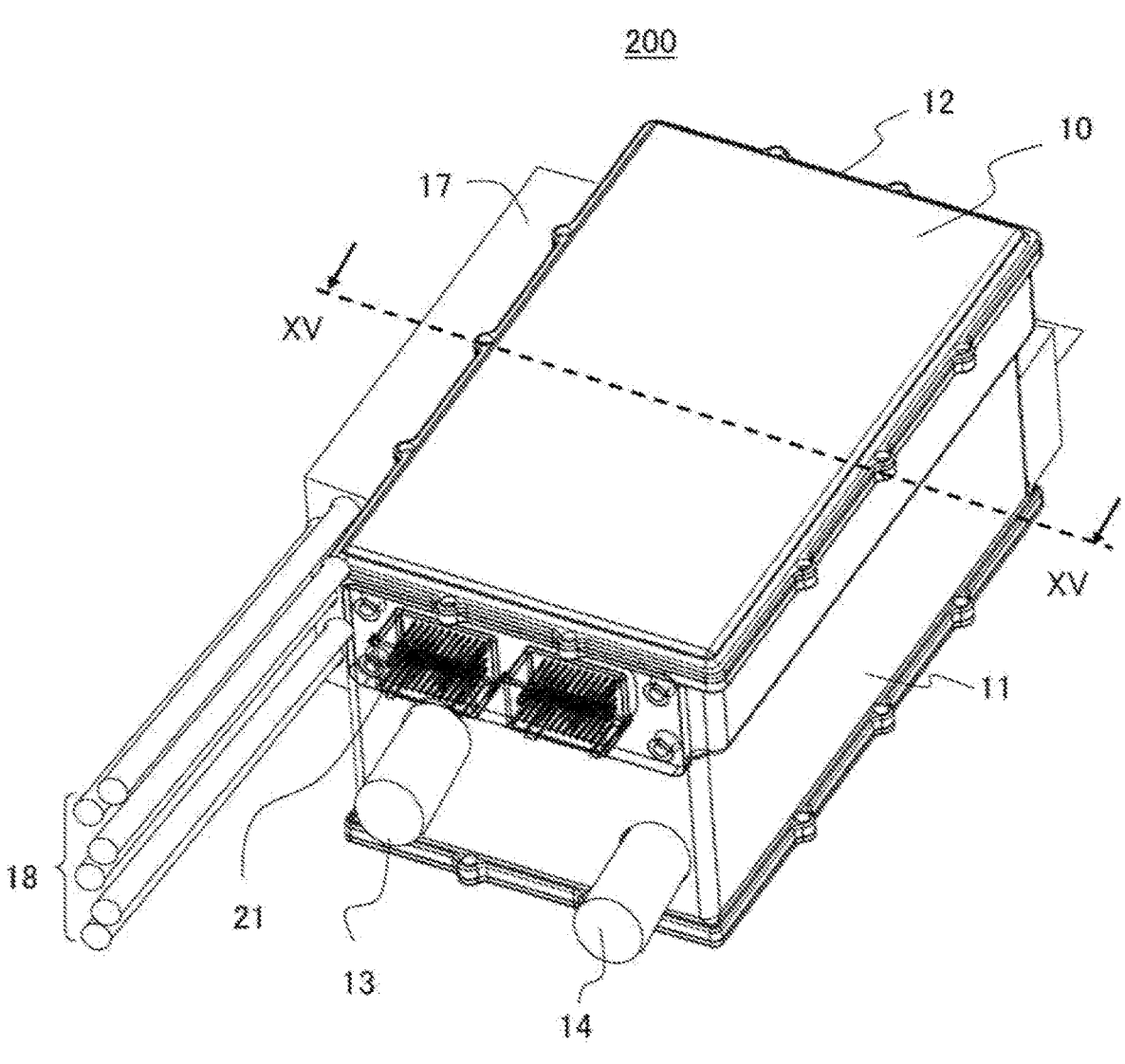
FIG. 15 is an outer appearance perspective view of the power conversion device.
Figure 16:
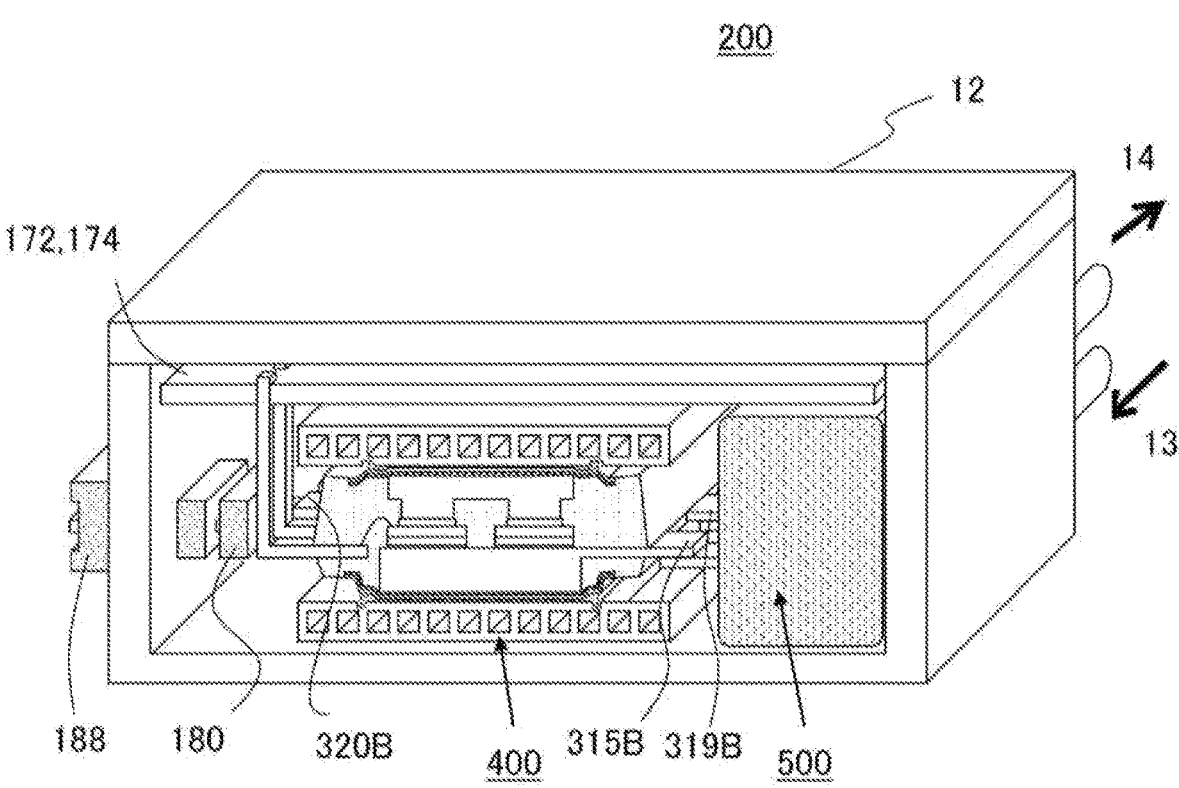
FIG. 16 is a cross-sectional perspective view taken along line XV-XV of the power conversion device.

FIG. 15 is an outer appearance perspective view of the power conversion device 200 illustrated in FIG. 14, and FIG. 16 is a cross-sectional perspective view taken along line XV-XV of the power conversion device 200 illustrated in FIG. 15. As illustrated in FIG. 15, the power conversion device 200 includes a housing 12 that is configured by a lower case 11 and an upper case 10 and is formed in a substantially rectangular parallelepiped shape. An electric circuit body 400, a capacitor module 500, and the like are accommodated in the housing 12. The electric circuit body 400 has a cooling flow path, and a cooling water inflow pipe 13 and a cooling water outflow pipe 14 communicating with the cooling flow path are protruded from one side surface of the housing 12. The lower case 11 has an opening on the upper side (Z direction), and the upper case 10 is attached to the lower case 11 by closing the opening of the lower case 11. The upper case 10 and the lower case 11 are formed of an aluminum alloy or the like, and are sealed and fixed to the outside. The upper case 10 and the lower case 11 may be integrated. Since the housing 12 has a simple rectangular parallelepiped shape, attachment to a vehicle or the like is facilitated, and productivity is also improved.

A connector 17 is attached to one side surface of the housing 12 in the longitudinal direction, and an AC terminal 18 is connected to the connector 17. Furthermore, a connector 21 is provided on a surface from which the cooling water inflow pipe 13 and the cooling water outflow pipe 14 are led out.

As illustrated in FIG. 16, the electric circuit body 400 is accommodated in the housing 12. A control circuit 172 and a driver circuit 174 are disposed above the electric circuit body 400, and a capacitor module 500 is accommodated on the DC terminal side of the electric circuit body 400. The power conversion device 200 can be thinned, and the degree of freedom in installation on the vehicle is improved by disposing the capacitor module at the same height as the electric circuit body 400. The AC side terminal 320B of the electric circuit body 400 penetrates the current sensor 180 and is joined to the bus bar. The positive electrode side terminal 315B and the negative electrode side terminal 319B, which are DC terminals of the electric circuit body 400, are respectively joined to positive and negative electrode terminals (DC terminals 362A and 362B in FIG. 14) of the capacitor module 500.

The embodiment described above has the following operation effect.

(1) An electric circuit body 400 is an electric circuit body 400 including a power semiconductor element 159 joined to one surface of conductor plates 430, 431, 432, and 433, sheet members 440 and 441 including an insulating layer joined to the other surface of the conductor plates 430, 431, 432, and 433, a sealing member 360 that integrally seals the sheet members 440 and 441, the conductor plates 430, 431, 432, and 433, and the power semiconductor element 159 in a state where a surface of the sheet members 440 and 441 opposite to a surface joined to the conductor plates 430, 431, 432, and 433 is exposed, a cooling member 340 that cools heat of the power semiconductor element 159, and a heat conduction member 453 provided between the surface opposite to the sheet members 440 and 441 and the cooling member 340, where the heat conduction member 453 is provided across a first projection region P1 facing the conductor plates 430, 431, 432, and 433, and a second projection region P2 facing the sealing member 360, and the thickness of the heat conduction member 453 is thicker in the second projection region P2 than in the first projection region P1. This makes it possible to suppress peeling of the sheet member.

The present invention is not limited to the embodiments described above, and other modes conceivable within the scope of the technical idea of the present invention are also included in the scope of the present invention as long as the characteristics of the present invention are not impaired. In addition, the embodiment described above and a plurality of modified examples may be combined.

REFERENCE SIGNS LIST

10 upper case
11 lower case
13 cooling water inflow pipe
14 cooling water outflow pipe
17, 21 connector
18 AC terminal
43, 140, 142 inverter circuit
155 first power semiconductor element (upper arm circuit active element)
156 first power semiconductor element (upper arm circuit diode)
157 second power semiconductor element (lower arm circuit active element)
158 second power semiconductor element (lower arm circuit diode)
172 control circuit
174 driver circuit
180 current sensor
181, 182, 188 connector
192, 194 motor generator
200 power conversion device
300 power module
310 circuit body
315B positive electrode side terminal
319B negative electrode side terminal
320B AC side terminal
325 signal terminal
325K Kelvin emitter signal terminal
325L lower arm gate signal terminal
325M mirror emitter signal terminal
325U upper arm gate signal terminal
340 cooling member
341 concave portion of cooling member
342 concave portion of sheet member
360 sealing member
400 electric circuit body
430 first conductor plate (upper arm circuit emitter side)
431 second conductor plate (upper arm circuit collector side)
432 third conductor plate (lower arm circuit emitter side)

433 fourth conductor plate (lower arm circuit collector side)
440 first sheet-shaped member (emitter side)
441 second sheet-shaped member (collector side)
442 first resin insulating layer (emitter side)
443 second resin insulating layer (collector side)
444 metal foil
453 heat conduction member
500 capacitor module
601 transfer molding device
602 spring
700 peeled portion
P1 first projection region
P2 second projection region

The invention claimed is:

1. An electric circuit body comprising:
a power semiconductor element joined to one surface of a conductor plate;
a sheet member including an insulating layer joined to the other surface of the conductor plate;
a sealing member that integrally seals the sheet member, the conductor plate, and the power semiconductor element in a state in which a surface of the sheet member opposite to a surface joined to the conductor plate is exposed;
a cooling member that cools heat of the power semiconductor element; and
a heat conduction member provided between the opposite surface of the sheet member and the cooling member,
wherein the heat conduction member is provided over a first projection region facing the conductor plate and a second projection region facing the sealing member, and a thickness of the heat conduction member is thicker in the second projection region than in the first projection region, and
wherein the sheet member is depressed in the sealing member to form a concave portion, and the heat conduction member enters the concave portion.

2. The electric circuit body according to claim 1, wherein an outer edge of a joining region where the heat conduction member and the sheet member are adhered or joined is located on an outer peripheral side of the first projection region.

3. The electric circuit body according to claim 2, wherein the cooling member is provided including the first projection region facing the conductor plate, and the first projection region is located on an inner peripheral side within the outer edge of the joining region.

4. The electric circuit body according to claim 1, wherein the cooling member is formed with a concave portion into which the heat conduction member enters.

5. The electric circuit body according to claim 1, wherein an end portion of the cooling member is located in the second projection region or at a boundary between the first projection region and the second projection region.

6. The electric circuit body according to claim 5, wherein the heat conduction member is adhered or joined to a side surface of an end portion of the cooling member.

7. The electric circuit body according to claim 1, wherein an area where the heat conduction member is adhered or joined to a surface of the sheet member exposed from the sealing member is larger than an area of the first projection region facing the conductor plate.

8. The electric circuit body according to claim 1, wherein
the conductor plate comprises two conductor plates disposed on both surfaces of the power semiconductor element, one surface of each of the disposed conductor plates being joined to the power semiconductor element,
the sheet member comprises two sheet members joined to the other surface of each of the conductor plates, and
the cooling member comprises two cooling members adhered to each of the sheet members by way of the heat conduction member.

9. A power conversion device comprising the electric circuit body described in claim 1,
wherein DC power is converted into AC power.

* * * * *